United States Patent
Huang

(10) Patent No.: US 10,193,106 B2
(45) Date of Patent: Jan. 29, 2019

(54) METHOD FOR MANUFACTURING OLED DEVICE

(71) Applicant: Shenzhen China Star Optoelectronics Technology Co., Ltd., Shenzhen, Guangdong (CN)

(72) Inventor: Hui Huang, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/500,196

(22) PCT Filed: Jan. 19, 2017

(86) PCT No.: PCT/CN2017/071635
§ 371 (c)(1),
(2) Date: Dec. 7, 2017

(87) PCT Pub. No.: WO2018/120341
PCT Pub. Date: Jul. 5, 2018

(65) Prior Publication Data
US 2018/0219186 A1    Aug. 2, 2018

(51) Int. Cl.
*H01L 51/56*   (2006.01)
*H01L 27/32*   (2006.01)
(Continued)

(52) U.S. Cl.
CPC .............. *H01L 51/56* (2013.01); *H01L 27/32* (2013.01); *H01L 51/0024* (2013.01);
(Continued)

(58) Field of Classification Search
CPC ............................ H01L 51/0024; H01L 27/32
See application file for complete search history.

(56) References Cited

U.S. PATENT DOCUMENTS

| 2005/0014023 A1* | 1/2005 | Yu ........................... C08G 61/12 428/690 |
| 2007/0109218 A1 | 5/2007 | Saito et al. |
| 2015/0320915 A1 | 11/2015 | Schmidt et al. |

FOREIGN PATENT DOCUMENTS

| CN | 101876866 | 11/2010 |
| CN | 102473853 | 5/2012 |

(Continued)

OTHER PUBLICATIONS

Search report and Written Opinion, dated Jul. 27, 2017, for International Application No. PCT/CN2017/071635.

(Continued)

*Primary Examiner* — Caridad Everhart
*Assistant Examiner* — Ankush Singal

(57) ABSTRACT

Disclosed is a method for manufacturing an OLED device. The method includes steps of: providing a substrate and manufacturing an anode and a buffer layer in sequence on the substrate; subjecting the substrate to an acid treatment; drying the substrate and manufacturing a liquid light emitting layer on the buffer layer; providing a cover plate and manufacturing a cathode and an electron transport layer in sequence on the cover plate; subjecting the cover plate to the acid treatment; and bonding the cover plate and the substrate together by lamination to obtain an OLED device. According to the method, performance of a device can be improved stably, and thus light emitting efficiency of the device can be enhanced.

12 Claims, 1 Drawing Sheet

(51) Int. Cl.
  *H01L 51/50* (2006.01)
  *H01L 51/52* (2006.01)
  *H01L 51/00* (2006.01)
(52) U.S. Cl.
  CPC ...... *H01L 51/5072* (2013.01); *H01L 51/5206* (2013.01); *H01L 51/5221* (2013.01)

(56) References Cited

FOREIGN PATENT DOCUMENTS

| | | |
|---|---|---|
| CN | 103333355 | 10/2013 |
| CN | 103682133 | 3/2014 |
| CN | 104749802 | 7/2015 |
| CN | 105870346 | 8/2016 |
| JP | 2015096326 | 5/2015 |

OTHER PUBLICATIONS

Office Action and Search Report, dated Dec. 27, 2017, for Chinese Patent Application No. 201611235030.6, Nov. 10, 2018.

* cited by examiner

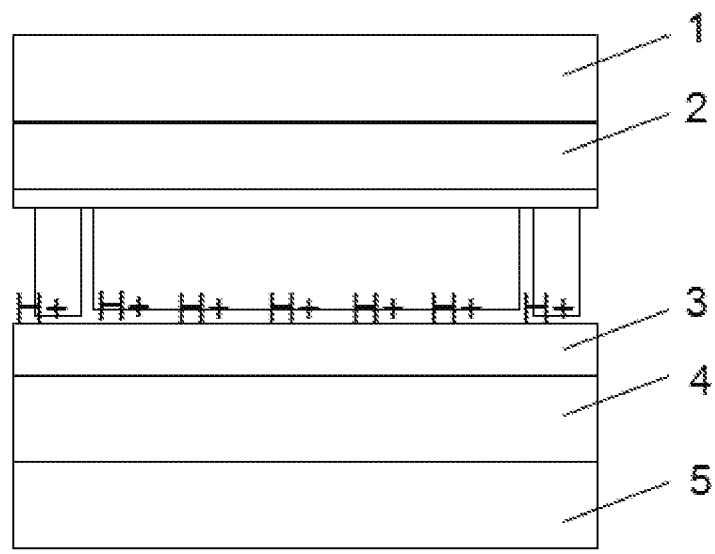

METHOD FOR MANUFACTURING OLED DEVICE

CROSS-REFERENCE TO RELATED APPLICATIONS

This application claims the priority of Chinese patent application CN 201611235030.6, entitled "Method for manufacturing OLED device" and filed on Dec. 28, 2016, the entirety of which is incorporated herein by reference.

FIELD OF THE INVENTION

The present disclosure relates to the technical field of electronic light emitting device, and in particular, to a method for manufacturing an OLED device.

BACKGROUND OF THE INVENTION

At present, in the fields of lighting and display, organic light-emitting diodes (OLEDs) have attracted more and more attention because of their features of low starting voltage, lightness and thinness, and self-luminescence, and are widely used in the development of lighting products and display panels.

Flexible OLED display is a main direction of research. However, at present, a main problem in manufacture of a flexible device lies in that: when a substrate is bent, it is easy for structures between film layers to be influenced by the stress, which results in a fracture of molecular chains and degradation of device performance. Therefore, a liquid light emitting layer is introduced in some researches. Liquid light emitting materials can be used for manufacture of a flexible device because of their liquid or semi-solid state. Connection between molecules of a liquid light emitting material would not be affected by a bend. However, although a liquid light emitting layer has a simple structure, since the liquid light emitting layer needs to be bonded together with a substrate and a cover plate, this physical bonding method would result in degradation of bonding capacity between organic layers and poor connection between film layers.

Therefore, it is necessary to provide a method to improve a bonding capacity between film layers.

SUMMARY OF THE INVENTION

In order to solve the above problem, the present disclosure provides a method for manufacturing an OLED device. The method comprises following steps of:

a. providing a substrate and manufacturing an anode and a buffer layer in sequence on the substrate;

b. subjecting the substrate with the anode and the buffer layer thereon to acid treatment;

c. drying the substrate and manufacturing a liquid light emitting layer on the buffer layer;

d. providing a cover plate and manufacturing a cathode and a electron transport layer in sequence on the cover plate;

e. subjecting the cover plate with the cathode and the electron transport layer thereon to the acid treatment; and f. bonding the cover plate and the substrate together by lamination to obtain the OLED device.

According to a preferred embodiment of the present disclosure, the substrate and the cover plate are subjected to the acid treatment under same conditions. An acid used for the acid treatment is a dilute acid having a mass fraction in a range from 5% to 30%, such as one or more of hydrochloric acid, sulfuric acid, acetic acid, and nitric acid.

During an acid treatment process, the substrate is soaked in an acid solution. Preferably, during the acid treatment process, the acid solution is heated, so as to accelerate attachment. Preferably, the acid treatment is performed at a temperature in a range from 25° C. to 40° C., and a time length of the acid treatment is in a range from 4 h to 12 h.

In the present disclosure, an anode material is selected from commonly used materials such as silver, gold, or indium tin oxide compounds.

According to a preferred embodiment of the present disclosure, in step b, the buffer layer is manufactured by spin coating, ink-jetting or coating. The buffer layer is dried and then subjected to the acid treatment.

According to a preferred embodiment of the present disclosure, a material of the buffer layer is doped or modified PEDOT:PSS. PEDOT is poly (3,4-ethylenedioxythiophene). PSS is polystyrene sulfonate.

According to a preferred embodiment of the present disclosure, a material of the liquid light emitting layer is a homologue of phosphorescent molecules.

According to a preferred embodiment of the present disclosure, in step c, in order to prevent flow of the liquid light emitting layer, a spacer layer is further manufactured after the liquid light emitting layer is manufactured. A material of the spacer layer is selected from metal materials suitable for vapor deposition, such as one or more of silver, magnesium, and gold.

According to a preferred embodiment of the present disclosure, a material of the electron transport layer is titanium dioxide. The electron transport layer has a thickness in a range from 5 μm to 15 μm.

In the method provided by the present disclosure, the substrate is treated with an acid after the buffer layer is manufactured thereon, and a layer of $H^+$ is attached on a surface of the substrate. After that, the liquid light emitting layer is manufactured. Oxygen atoms in the liquid light emitting layer are bonded to $H^+$ on a surface of the buffer layer under an action of a hydrogen bond, such that the liquid light emitting layer is anchored to the surface of the buffer layer. Thus, a bonding capacity between layers can be improved, and electron transport can be enhanced. Similarly, the cover plate is treated with an acid after the electron transport layer is manufactured thereon, and thus a bonding capacity between the liquid light emitting layer and the electron transport layer is enhanced. After the substrate and the cover plate are bonded together, the liquid light emitting layer is more effectively connected to the substrate and the cover plate, thereby providing a carrier transporting channel. A recombination rate between electrons and holes can be improved, performance of a device can be improved stably, and light emitting efficiency can enhanced.

BRIEF DESCRIPTION OF THE DRAWINGS

The accompanying drawings provide further understandings of the present disclosure and constitute one part of the description. The drawings are used for interpreting the present disclosure together with the embodiments, not for limiting the present disclosure. In the drawing:

FIG. 1 schematically shows a structure of an OLED device of the present disclosure.

DETAILED DESCRIPTION OF THE EMBODIMENTS

The present disclosure will be explained below in a detailed way with reference to embodiments, and will not be limited by the embodiments described hereafter.

Embodiment 1

An OLED device is manufactured by using a method as follows.

1) A substrate is manufactured. A glass substrate is provided. An anode is manufactured on the glass substrate. Conventional anode materials, such as silver, gold, indium tin oxide compounds, can all be used to manufacture the anode. A buffer layer is manufactured on the anode by spin coating. PEDOT:PSS is selected as a material for the buffer layer. Then, the buffer layer is dried. The substrate with the anode and the buffer layer thereon is soaked in a hydrochloric acid solution having a mass fraction of 28% for an acid treatment. A soaking temperature is 28° C., and a soaking time length is 10 h. Next, the soaked substrate is dried, and a layer of $H^+$ is attached on a surface of the substrate. After that, a liquid light emitting layer is manufactured, and a material of the liquid light emitting layer is a homologue of phosphorescent molecules.

2) A cover plate is manufactured. A cathode is manufactured on the cover plate. A layer of titanium dioxide having a thickness in a range from 5 µm to 15 µm is formed on the cathode by spin coating or spraying. Then, the formed cover plate is soaked in a hydrochloric acid solution having a mass fraction of 28% for an acid treatment. A soaking temperature is 28° C., and a soaking time length is 10 h. The soaked cover plate is dried, and a layer of $H^+$ is attached on a surface of the cover plate.

Finally, the substrate and the cover plate are bonded together by lamination to obtain the OLED device.

Embodiment 2

An OLED device is manufactured by using a method as follows.

1) A substrate is manufactured. A glass substrate is provided. An anode is manufactured on the glass substrate. Conventional anode materials, such as silver, gold, indium tin oxide compounds, can all be used to manufacture the anode. A buffer layer is manufactured on the anode by spin coating. PEDOT:PSS is selected as a material for the buffer layer. Then, the buffer layer is dried. The substrate with the anode and the buffer layer thereon is soaked in a sulfuric acid solution having a mass fraction of 15% for an acid treatment. A soaking temperature is 32° C., and a soaking time length is 8 h. Next, the soaked substrate is dried, and a layer of H is attached on a surface of the substrate. After that, a liquid light emitting layer is manufactured, and a material of the liquid light emitting layer is a homologue of phosphorescent molecules. To prevent flow of the liquid light emitting layer, a spacer layer is manufactured on the liquid light emitting layer. A material of the spacer layer is selected from metal materials suitable for vapor deposition, such as silver, magnesium, and gold.

2) A cover plate is manufactured. A cathode is manufactured on the cover plate. A layer of titanium dioxide having a thickness in a range from 5 µm to 15 µm is formed on the cathode by spin coating or spraying. Then, the formed cover plate is soaked in a sulfuric acid solution having a mass fraction of 15% for an acid treatment. A soaking temperature is 32° C., and a soaking time length is 8 h. Next, the soaked cover plate is dried, and a layer of $H^+$ is attached on the cover plate.

Finally, the substrate and the cover plate are bonded together by lamination to obtain the OLED device.

The present disclosure is illustrated hereinabove with reference to some specific embodiments, but it should be understood that the embodiments disclosed herein can be improved without departing from the protection scope of the present disclosure. The technical features disclosed in each and every embodiment of the present disclosure can be combined with one another in any way. Details of these combinations of the embodiments are omitted herein only for brevity and resource saving. Therefore, the present disclosure is not limited by the specific embodiments disclosed herein, but includes all technical solutions falling into the protection scope of the claims.

LIST OF REFERENCE NUMBERS

1—Cover plate;
2—Cathod;
3—Buffer layer;
4—Anode; and
5—Substrate.

The invention claimed is:

1. A method for manufacturing an OLED device, comprising steps of:
   a. providing a substrate and manufacturing an anode and a buffer layer in sequence on the substrate;
   b. subjecting the substrate with the anode and the buffer layer thereon to an acid treatment;
   c. drying the substrate and manufacturing a liquid light emitting layer on the buffer layer;
   d. providing a cover plate and manufacturing a cathode and an electron transport layer in sequence on the cover plate;
   e. subjecting the cover plate with the cathode and the electron transport layer thereon to the acid treatment; and
   f. bonding the cover plate and the substrate together by lamination to obtain the OLED device.

2. The method according to claim 1, wherein the acid treatment refers to soaking the substrate or the cover plate in an acid solution, and an acid used is a dilute acid having a mass fraction in a range from 5% to 30%.

3. The method according to claim 2, wherein the acid used in the acid treatment is one or more of hydrochloric acid, sulfuric acid, acetic acid, and nitric acid.

4. The method according to claim 1, wherein the acid treatment is performed at a temperature in a range from 25° C. to 40° C. and a time length of the acid treatment is in a range from 4 h to 12 h.

5. The method according to claim 2, wherein the acid treatment is performed at a temperature in a range from 25° C. to 40° C. and a time length of the acid treatment is in a range from 4 h to 12 h.

6. The method according to claim 1, wherein, in step b, the buffer layer is manufactured by spin coating, ink-jetting or coating, and the buffer layer is dried and then subjected to an acid treatment.

7. The method according to claim 1, wherein a material of the buffer layer is doped or undoped, or modified or unmodified PEDOT:PSS.

8. The method according to claim 1, wherein a material of the liquid light emitting layer is a homologue of phosphorescent molecules.

9. The method according to claim 1, wherein, in step c, a spacer layer is further manufactured, after the liquid light emitting layer is manufactured.

10. The method according to claim 9, wherein a material of the spacer layer is selected from one or more of silver, magnesium, and gold.

11. The method according to claim 1, wherein a material of the electron transport layer is titanium dioxide.

12. The method according to claim 1, the electron transport layer has a thickness in a range from 5 μm to 15 μm.

* * * * *